United States Patent
Dove et al.

(10) Patent No.: US 7,014,784 B2
(45) Date of Patent: Mar. 21, 2006

(54) METHODS AND APPARATUS FOR PRINTING CONDUCTIVE THICKFILMS OVER THICKFILM DIELECTRICS

(75) Inventors: Lewis R. Dove, Monument, CO (US); John F. Casey, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 161 days.

(21) Appl. No.: 10/793,022

(22) Filed: Mar. 3, 2004

(65) Prior Publication Data

US 2005/0195052 A1    Sep. 8, 2005

(51) Int. Cl.
*H01B 13/00*    (2006.01)

(52) U.S. Cl. .............................. 216/13; 216/95; 216/96; 29/846; 29/847

(58) Field of Classification Search ................... None
See application file for complete search history.

(56) References Cited

U.S. PATENT DOCUMENTS

| | | | |
|---|---|---|---|
| 4,808,274 A * | 2/1989 | Nguyen ..................... | 361/748 |
| 5,317,292 A | 5/1994 | Leeb | |
| 5,357,138 A | 10/1994 | Kobayashi | |
| 5,426,399 A | 6/1995 | Matsubayashi et al. | |
| 5,639,989 A * | 6/1997 | Higgins, III ............. | 174/35 MS |
| 6,000,120 A * | 12/1999 | Arledge et al. ................ | 29/600 |
| 6,255,730 B1 * | 7/2001 | Dove et al. .................. | 257/728 |
| 6,353,189 B1 | 3/2002 | Shimada et al. | |
| 6,457,979 B1 * | 10/2002 | Dove et al. ..................... | 439/63 |
| 2003/0005572 A1 * | 1/2003 | Gardner ..................... | 29/602.1 |

OTHER PUBLICATIONS

Casey, et al., "Methods for Making Microwave Circuits", U.S. Appl. No. 10/600,143, filed Jun. 19, 2003.
Casey, et al., "Methods for Depositing a Thickfilm Dielectric on a Substrate", U.S. Appl. No. 10/600,600, filed Jun. 19, 2003.
Casey, et al., "Methods for Forming a Conductor on a Dielectric", U.S. Appl. No. 10/601,042, filed Jun. 19, 2003.

* cited by examiner

Primary Examiner—Nadine G. Norton
Assistant Examiner—Eric B. Chen

(57) ABSTRACT

In one embodiment, a plurality of thickfilm dielectric layers are printed on a substrate, with each successive layer being printed over a previous layer, and with each layer having sloped walls. After printing a first subset of the plurality of thickfilm dielectric layers, a first conductive thickfilm is printed over at least the walls of the first subset of dielectric layers. Then, after printing a second subset of the plurality of thickfilm dielectric layers, a second conductive thickfilm is printed over the second subset of dielectric layers (with the first and second conductive thickfilms being electrically coupled).

13 Claims, 3 Drawing Sheets

METHODS AND APPARATUS FOR PRINTING CONDUCTIVE THICKFILMS OVER THICKFILM DIELECTRICS

BACKGROUND OF THE INVENTION

Using current thickfilm printing techniques, it is difficult to print a conductive thickfilm over a structure or topology thicker than about 10 mils. Thus, when a conductor is bounded above and below by thickfilm dielectrics, each of the dielectrics is limited to a thickness of about 5 mils so that it is possible to print a thickfilm ground shield over the dielectric structure. However, limiting the thickness of the dielectrics that bound a conductor typically places limits on the conductor itself. For example, if one desires to build a transmission line structure having a given impedance, bounding a conductor with dielectrics of a given height and dielectric constant will dictate the width of the conductor. While such a "width limit" is sometimes irrelevant, there are times when a width limit is smaller than desired. For example, in one application, a conductor "width limit" was smaller than a width of a shunt component that an engineer wanted to couple into a transmission line structure.

SUMMARY OF THE INVENTION

One aspect of the invention is embodied in a method that comprises printing a plurality of thickfilm dielectric layers on a substrate, with each successive layer being printed over a previous layer, and with each layer having sloped walls. After printing a first subset of the plurality of thickfilm dielectric layers, a first conductive thickfilm is printed over at least the walls of the first subset of dielectric layers. Then, after printing a second subset of the plurality of thickfilm dielectric layers, a second conductive thickfilm is printed over the second subset of dielectric layers (with the first and second conductive thickfilms being electrically coupled).

Other embodiments of the invention are also disclosed.

BRIEF DESCRIPTION OF THE DRAWINGS

Illustrative and presently preferred embodiments of the invention are illustrated in the drawings, in which.

DESCRIPTION OF THE PREFERRED EMBODIMENT

Figure 1:
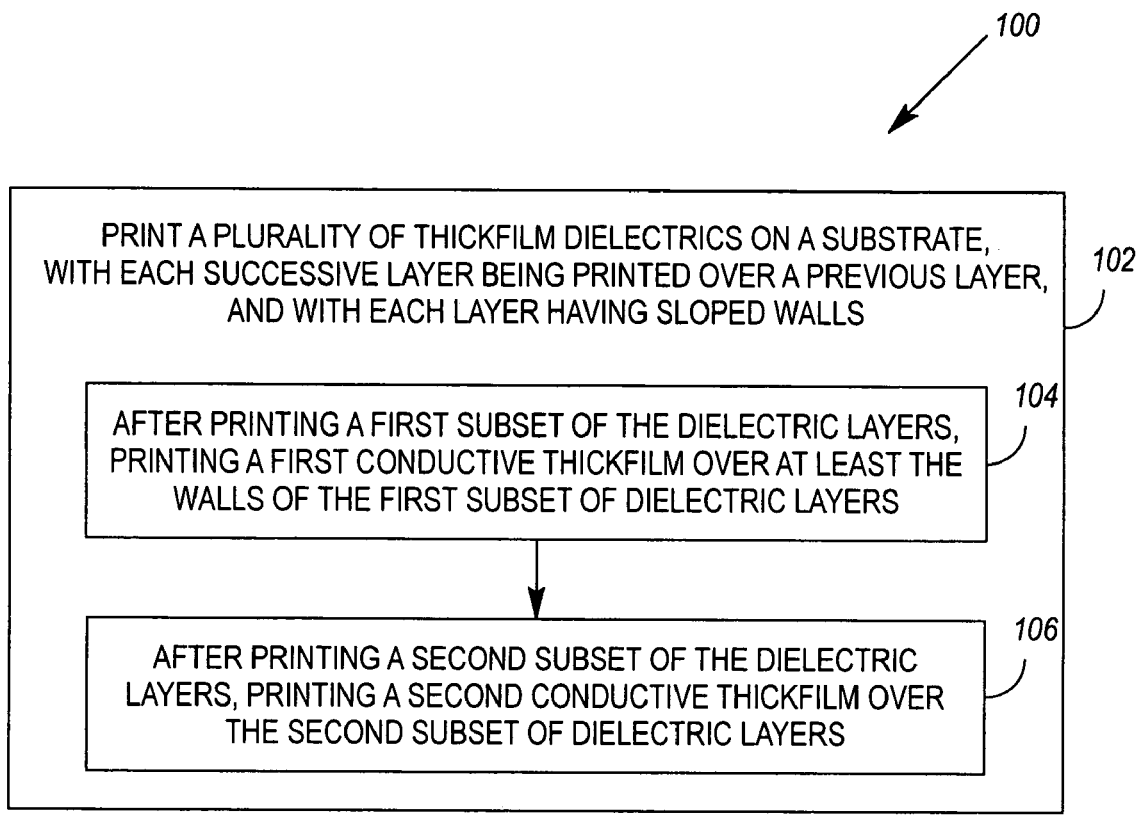
FIG. 1 illustrates a first exemplary embodiment of a method for printing conductive thickfilms over thickfilm dielectrics.

FIG. 1 illustrates a method 100 for printing conductive thickfilms over thickfilm dielectrics. The method 100 commences with the printing 102 of a plurality of thickfilm dielectric layers on a substrate, with each successive layer being printed over a previous layer, and with each layer having sloped walls. After printing a first subset of the plurality of thickfilm dielectric layers, a first conductive thickfilm is printed 104 over at least the walls of the first subset of dielectric layers. After printing a second subset of the plurality of thickfilm dielectric layers, a second conductive thickfilm is printed 106 over the second subset of dielectric layers (with the first and second conductive thickfilms being electrically coupled).

The method 100 is advantageous in that it provides for building thicker (taller) transmission line structures, yet allows conductive thickfilms to be printed over subsets of dielectrics that are below a thickness that can be handled by current thickfilm printing techniques. These advantages, in turn, enable transmission line structures to be built with wider conductors. Wider conductors might be needed for a variety of reasons. For example, and as briefly mentioned in the Background of the Invention, an engineer may want to couple a shunt component into a portion of a transmission line structure, and the mounting mechanism of the shunt component may require a wider conductor mounting area than was achievable using prior thickfilm printing techniques.

Figure 2:
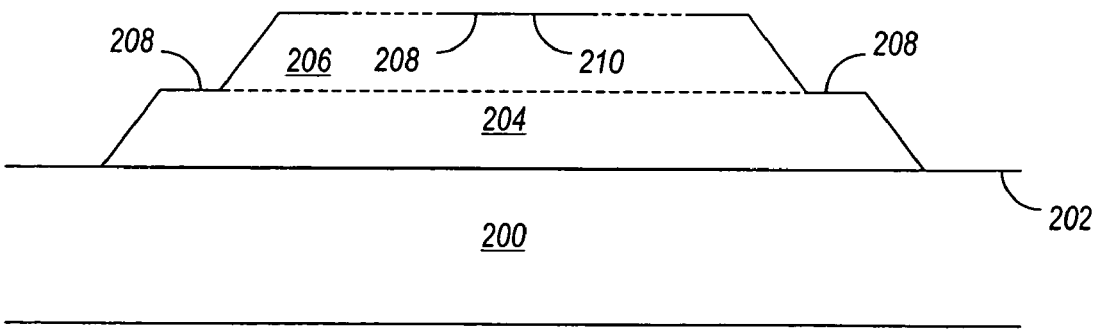
FIGS. 2 & 3 illustrate a first exemplary application of the FIG. 1 method.
Figure 3:
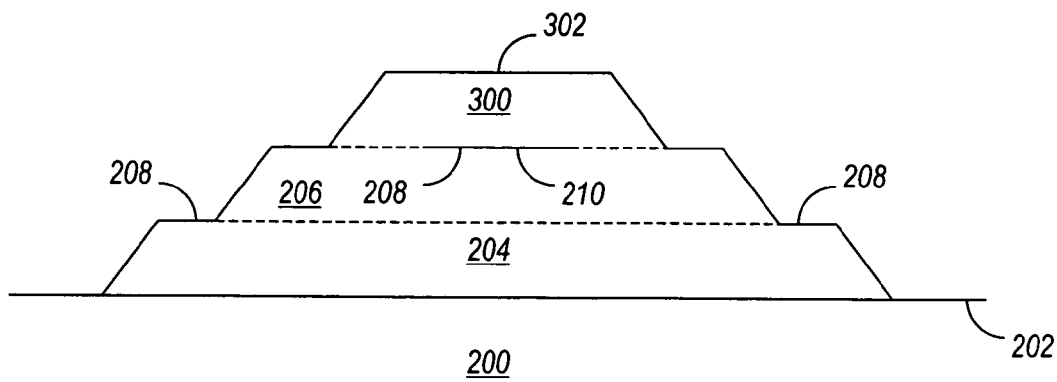

A first application of method 100 is shown in FIGS. 2 & 3. FIG. 2 illustrates a substrate 200 having a ground plane 202 thereon. A first subset of thickfilm dielectric layers 204, 206 is formed on the ground plane 202. A conductive thickfilm 208 is printed on at least the walls of the dielectrics 204, 206 and is electrically coupled to the ground plane 202. Alternatively, and as shown in the figure, the conductive thickfilm 208 may be printed over other portions of the dielectrics 204, 206 (e.g., over the top surface of the dielectrics), and a conductor 210 may then be formed by etching the conductive thickfilm 208.

To minimize irregularities in the conductor 210, the top surface of the dielectric 206 may be polished. The dielectric 206 may also be polished to control the combined thickness of the first subset of dielectrics 204, 206. The lower dielectric 204 need not be polished.

The conductive thickfilm 208 may extend up any portion of the walls of the dielectrics 204, 206. However, it is preferred that the conductive thickfilm 208 extend up and onto the top surface of the dielectric 206 so that it may be easily overprinted by a next printing of conductive thickfilm.

FIG. 3 shows the structure of FIG. 2 after a second subset of thickfilm dielectrics layers 300 has been printed over the first subset 204, 206. It should be noted that although the exemplary application shown in FIGS. 2 & 3 shows two layers 204, 206 in the first subset of dielectric layers and one layer 300 in the second subset of dielectric layers, each of the subsets could alternately comprise one, two or any number of layers, so long as the thickness of each subset is below that which may be printed by current thickfilm printing processes.

If it is desired to adjust the combined thickness of the second subset of dielectrics 300 may be polished. Thereafter, a second conductive thickfilm 302 is printed over the second subset of dielectrics such that the second conductive thickfilm 302 is electrically coupled to the first conductive thickfilm 208.

Figure 4:
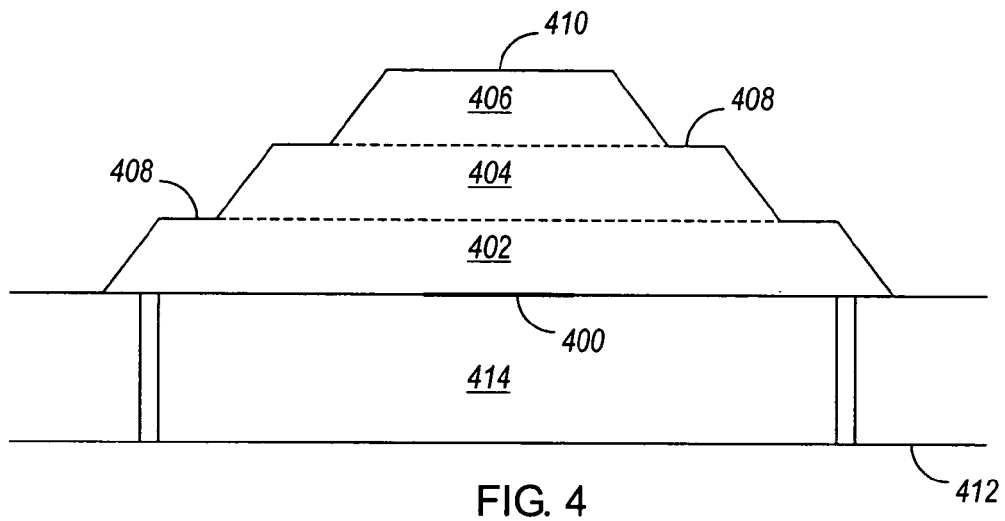
FIG. 4 illustrates a second exemplary application of the FIG. 1 method.

A second application of method 100 is shown in FIG. 4. In FIG. 4, a conductor 400 is printed below all of the dielectric layers 402, 404, 406, and first and second conductive thickfilms 408, 410 are printed on subsets of the dielectric layers 402/404, 406. If desired, a ground plane 412 could be formed on the bottom surface of a substrate 414, and vias and/or plated edges of the substrate could be used to electrically couple the ground plane 412 to the conductive thickfilms 408, 410.

Figure 5:
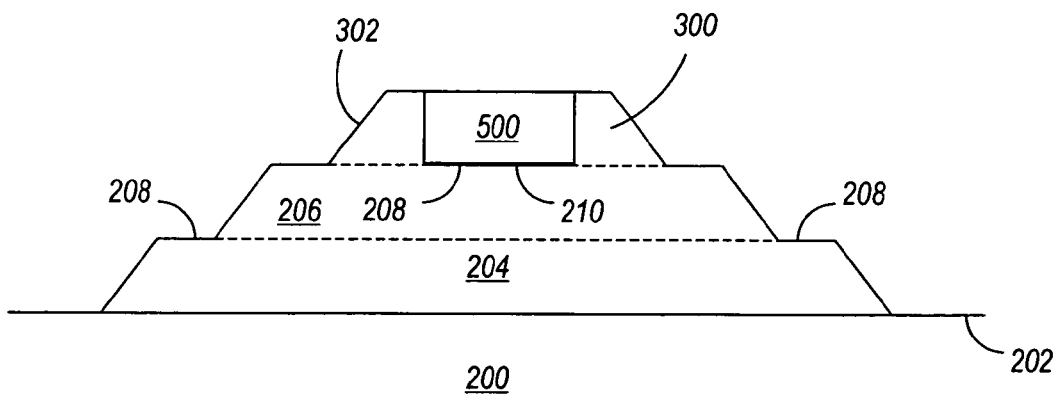
FIG. 5 illustrates a third exemplary application of the FIG. 1 method.

A third application of method 100 is shown in FIG. 5. FIG. 5 shows the same structures as FIG. 3, but with a shunt component 500 coupled to the conductor 210. By way of example, the shunt component 500 could be a diode or capacitor. In areas where shunt components are coupled to a transmission line structure, the top dielectric 300 and shielding 302 of the structure may need to be dispensed with. If a low loss dielectric like a KQ dielectric is used for the lower dielectrics, conductor loss in areas where shunt components are attached is dominated by conductor line width.

As will be understood by one of ordinary skill in the art, a plurality of thickfilm dielectric layers may comprise additional subsets of dielectric layers, each subset of which may be formed under, over or between the first and second subsets referenced in method 100, and of which may be printed with additional conductive thickfilms.

As will also be understood by one of ordinary skill in the art, a conductor need not be formed at its "maximum width" for its entire length. That is, in areas where there is a need to have a wider line width (e.g., because a shunt component needs to be attached), a conductor may be formed wider, and in other areas the conductor may be formed narrower.

By way of example, the substrates shown in the figures may be ceramic substrates (e.g., lapped alumina ceramic substrates), glass substrates, metallic substrates or polymer substrates. Also, by way of example, the dielectric layers shown may be glass dielectrics such as KQ dielectrics, or other dielectrics with suitable microwave properties. KQ dielectrics are manufactured by HERAEUS CERMALLOY (24 Union Hill Road, West Conshohocken, Pa., USA), and one such dielectric is KQ CL-90-7858 dielectric. By way of further example, the conductors, conductive thickfilms and ground planes shown in the figures may be formed of DUPONT QG150 gold (available from DUPONT (1007 Market Street, Wilmington, Del., USA)).

Using a 96% alumina ceramic substrate, KQ CL-90-7858 dielectric, and DUPONT QG150 gold, the third application of method 100 (FIGS. 2 & 3) has been used to print approximately 5 mil thick dielectric layers 204, 206, 300. The first subset 204, 206 of these layers has then been polished to 10 mils, and a conductor 210 that is 21.4 mils wide, with an impedance of 50 Ohms, has been formed. A typical shunt component 500 having dimensions of 20 mil×20 mil was able to be mounted on the conductor 210.

Variations and alternatives to the above methods for forming microwave transmission line structures are disclosed in U.S. Pat. No. 6,255,730 of Dove, et al. entitled "Integrated Low Cost Thick Film RF Module", United States patent application of Casey, et al. entitled "Methods for Making Microwave Circuits" (Ser. No. 10/600,143 filed Jun. 19, 2003), United States patent application of Casey, et al. entitled "Methods for Depositing a Thickfilm Dielectric on a Substrate" (Ser. No. 10/600,600 filed Jun. 19, 2003), and United States patent application of Casey, et al. entitled "Methods for Forming a Conductor on a Dielectric" (Ser. No. 10/601,042 filed Jun. 19, 2003), all of which are hereby incorporated by reference. It should be noted that the term "layer", as used herein, is intended to include not only a layer printed in one step, but also a layer printed in multiple steps, as disclosed in the patent applications of Casey, et al.

Figure 6:
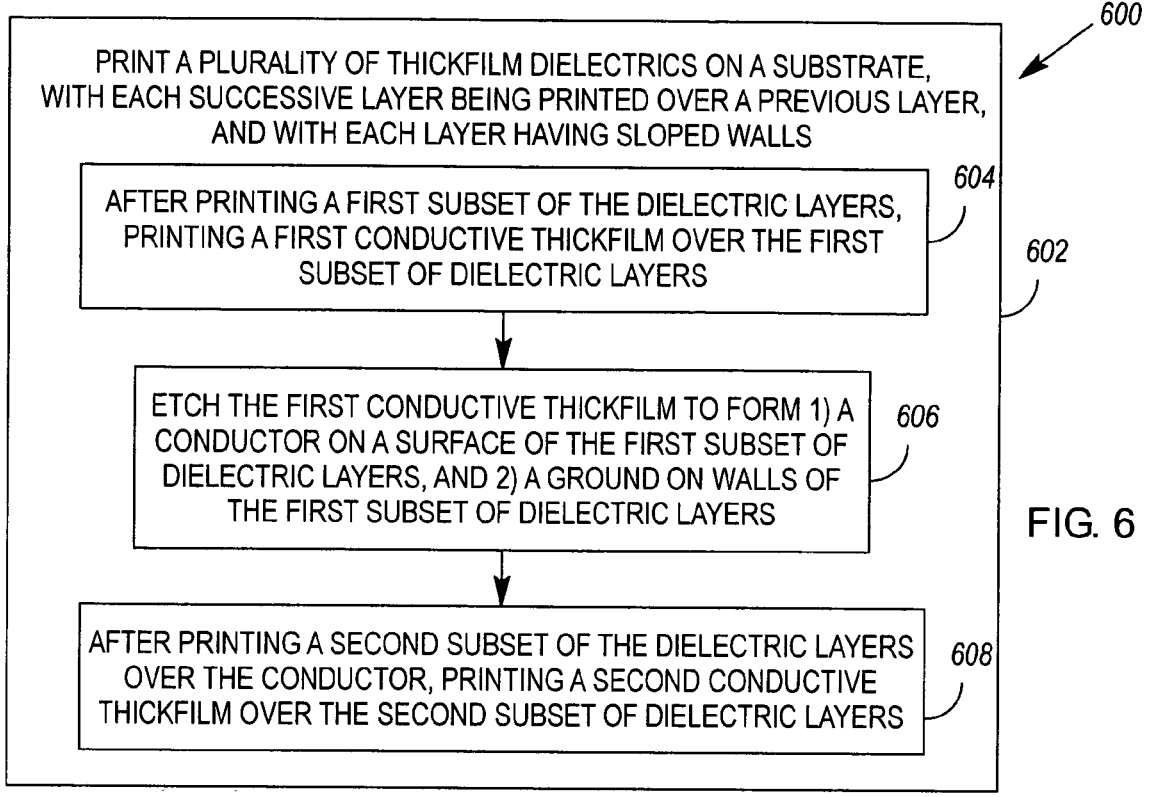
FIG. 6 illustrates a first exemplary method for producing a microwave circuit.

FIG. 6 illustrates a first exemplary method 600 for producing a microwave circuit. The method 600 comprises printing 602 a plurality of thickfilm dielectric layers on a substrate, with each successive layer being printed over a previous layer, and with each layer having sloped walls. After printing a first subset of the plurality of thickfilm dielectric layers, a first conductive thickfilm is printed 604 over the first subset of dielectric layers. The first conductive thickfilm is then etched 606 to form i) a conductor on a surface of the first subset of dielectric layers and ii) a ground on walls of the first subset of dielectric layers. After printing a second subset of the plurality of thickfilm dielectric layers over the conductor, a second conductive thickfilm is printed 608 over the second subset of dielectric layers (such that the second conductive thickfilm is electrically coupled to the ground walls on the first subset of dielectric layers).

Figure 7:
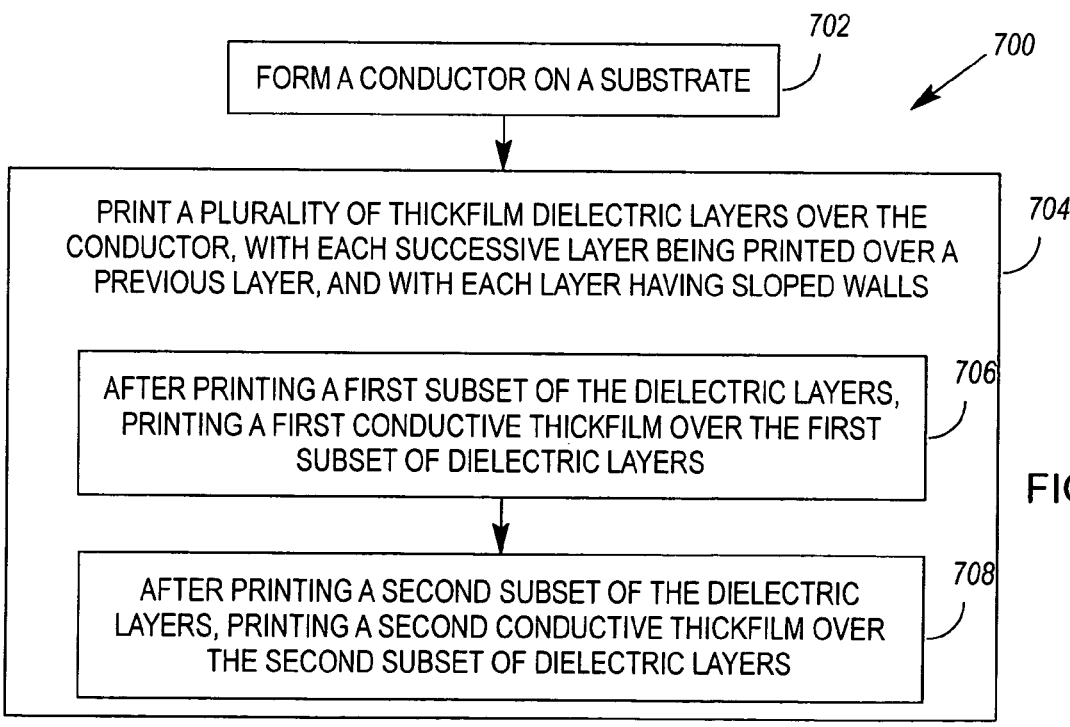
FIG. 7 illustrates a second exemplary method for producing a microwave circuit.

FIG. 7 illustrates a second exemplary method 700 for producing a microwave circuit. The method 700 comprises forming 702 a conductor on a substrate, and then printing 704 a plurality of thickfilm dielectric layers over the conductor. Each successive layer of thickfilm dielectric is printed over a previous layer, and each layer has sloped walls. After printing a first subset of the plurality of thickfilm dielectric layers, a first conductive thickfilm is printed 706 over at least the walls of the first subset of dielectric layers. Then, after printing a second subset of the plurality of thickfilm dielectric layers, a second conductive thickfilm is printed 708 over the second subset of dielectric layers (such that the first and second conductive thickfilms are electrically coupled).

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method, comprising:
   printing a plurality of thickfilm dielectric layers on a substrate, with each successive layer being printed over a previous layer, and with each layer having sloped walls;
   after printing a first subset of the plurality of thickfilm dielectric layers, printing a first conductive thickfilm over at least the walls of the first subset of dielectric layers; and
   after printing a second subset of the plurality of thickfilm dielectric layers, printing a second conductive thickfilm over the second subset of dielectric layers, wherein said first and second conductive thickfilms are electrically coupled.

2. The method of claim 1, further comprising, forming a conductor on the first subset of dielectric layers.

3. The method of claim 2, wherein the first conductive thickfilm is also printed over a surface of the first subset of dielectric layers, and wherein the conductor is formed by etching the conductor in the first conductive thickfilm.

4. The method of claim 2, further comprising, polishing a top surface of the first and second subsets of dielectric layers, prior to printing each of the conductive thickfilms.

5. The method of claim 2, further comprising, coupling a shunt component to the conductor.

6. The method of claim 5, wherein the shunt component is a diode.

7. The method of claim 5, wherein the shunt component is a capacitor.

8. The method of claim 1, further comprising, printing the plurality of thickfilm dielectric layers over a conductor.

9. The method of claim 1, wherein the plurality of thickfilm dielectric layers comprises additional subsets of dielectric layers, and wherein an additional conductive thickfilm is printed on at least the walls of each additional subset.

10. The method of claim 1, wherein the first subset of dielectric layers comprises at least two dielectric layers.

11. The method of claim 1, wherein the second subset of dielectric layers comprises at least two dielectric layers.

12. The method of claim 1, wherein the dielectric layers comprise a borosilicate glass based material with a dielectric constant of about 3.9 and a loss of about $10^{-4}$.

13. The method of claim 1, further comprising, printing the plurality of dielectric layers on a ground plane, wherein each of the conductive thickfilms are electrically coupled to the ground plane.

* * * * *